(12) United States Patent
Berthelon et al.

(10) Patent No.: US 11,723,220 B2
(45) Date of Patent: Aug. 8, 2023

(54) STRAINED TRANSISTORS AND PHASE CHANGE MEMORY

(71) Applicant: STMicroelectronics (Crolles 2) SAS, Crolles (FR)

(72) Inventors: Remy Berthelon, Saint Martin d'Heres (FR); Olivier Weber, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 278 days.

(21) Appl. No.: 17/244,514

(22) Filed: Apr. 29, 2021

(65) Prior Publication Data

US 2021/0343788 A1    Nov. 4, 2021

(30) Foreign Application Priority Data

Apr. 30, 2020   (FR) ...................... 2004330

(51) Int. Cl.
*H10B 63/00*         (2023.01)
(52) U.S. Cl.
CPC ............. *H10B 63/32* (2023.02); *H10B 63/80* (2023.02)
(58) Field of Classification Search
CPC ...... H10B 63/32; H10B 63/80; H01L 21/8249
See application file for complete search history.

(56) References Cited

U.S. PATENT DOCUMENTS

| | | |
|---|---|---|
| 9,653,538 B2 | 5/2017 | Boeuf et al. |
| 9,929,146 B2 | 3/2018 | Weber et al. |
| 2009/0286368 A1 | 11/2009 | Lam et al. |
| 2010/0059829 A1 | 3/2010 | Pellizzer et al. |

FOREIGN PATENT DOCUMENTS

FR    3 049 111 A1    9/2017

OTHER PUBLICATIONS

Berthelon et al., "A novel dual isolation scheme for stress and back-bias maximum efficiency in FDSOI Technology," 2016 IEEE International Electron Devices Meeting (IEDM), San Francisco, CA, USA, Dec. 3-7, 2016, pp. 468-471.

*Primary Examiner* — Marvin Payen
(74) *Attorney, Agent, or Firm* — Seed IP Law Group LLP

(57) ABSTRACT

A method for manufacturing an electronic chip includes providing a semiconductor layer located on an insulator covering a semiconductor substrate. First and second portions of the semiconductor layer are oxidized up to the insulator. Stresses are generated in third portions of the semiconductor layer, and each of the third portions extend between two portions of the semiconductor layer that are oxidized. Cavities are formed which extend at least to the substrate through the second portions and the insulator. Bipolar transistors are formed in at least part of the cavities and first field effect transistors are formed in and on the third portions. Phase change memory points are coupled to the bipolar transistors.

20 Claims, 6 Drawing Sheets

SA

SB    SC

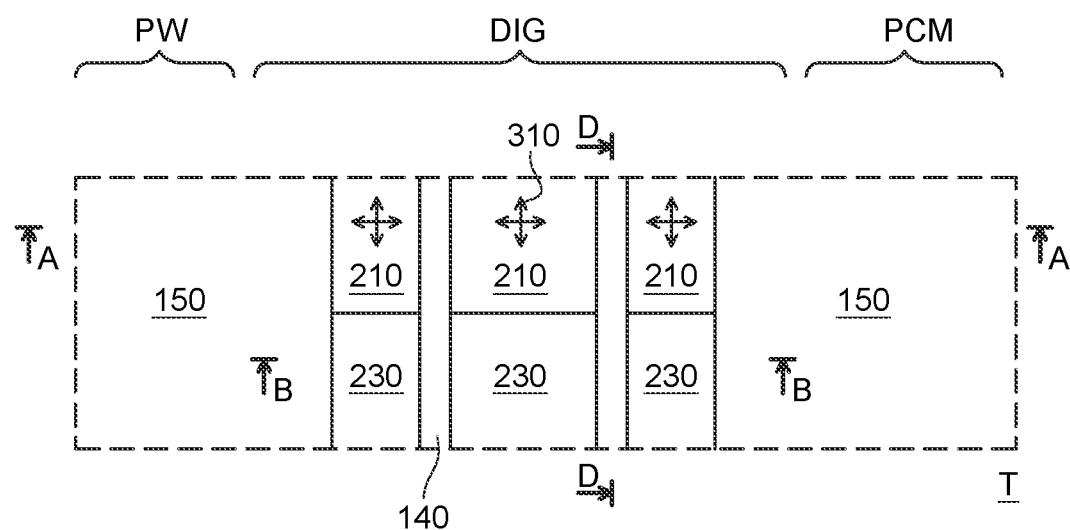
Fig. 3A
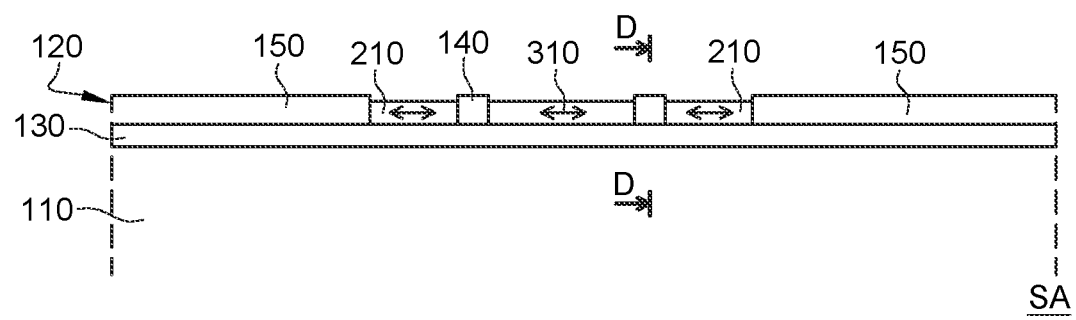
Fig. 3B
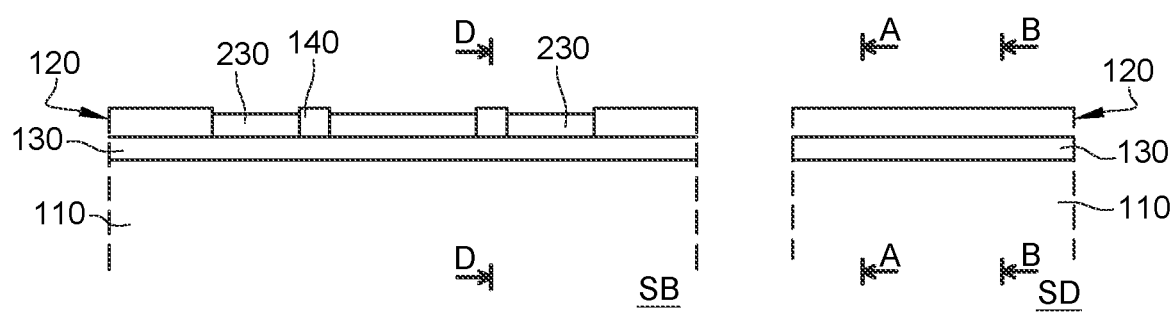

STRAINED TRANSISTORS AND PHASE CHANGE MEMORY

BACKGROUND

Technical Field

The present disclosure relates generally to integrated circuit electronic chips, and in particular an electronic chip comprising transistors with a strained channel region and a phase change memory.

Description of the Related Art

A transistor with a strained channel region, or strained transistor, is a field effect transistor in which a channel-forming semiconductor region has mechanical stresses. The presence of stresses in the channel-forming region allows the speed of the transistor to be increased. This type of transistor is used in digital circuits.

A phase change memory is a type of memory in which a phase change material can assume two states, typically crystalline and amorphous states, each corresponding to a stored bit value. Typically, the memory is made up of phase change memory points each storing the value of a bit.

BRIEF SUMMARY

There is a need for electronic chips comprising both one or more strained transistor digital circuits, and one or more phase change memories.

One embodiment addresses all or some of the drawbacks of known electronic chips.

One embodiment addresses all or some of the drawbacks of known methods for manufacturing electronic chips.

One embodiment provides a method for manufacturing an electronic chip, comprising the successive steps consisting of:
  providing a semiconductor layer located on an insulator covering a semiconductor substrate;
  oxidizing first and second portions of the semiconductor layer up to the insulator;
  generating stresses in the third portions of the semiconductor layer each extending between two portions of the semiconductor layer oxidized in the preceding step;
  forming cavities extending at least to the substrate through the second portions and the insulator;
  forming bipolar transistors in at least part of the cavities and first field effect transistors in and on the third portions; and
  forming phase change memory points coupled to the bipolar transistors.

One embodiment provides an electronic chip, comprising:
  first, second and third portions of a layer comprising a semiconductor located on an insulator covering a semiconductor substrate, the first and second portions of said layer being oxidized to the insulator, and the third portions being strained and each extending between two oxidized portions of said layer;
  bipolar transistors located in at least a part of cavities extending at least to the substrate through the second portions and the insulator;
  first field effect transistors located in and on the third portions; and
  phase change memory points coupled to the bipolar transistors.

According to one embodiment:
  for each of the third portions, said layer comprises a fourth portion extending next to the third portion between the oxidized portions; and
  second field effect transistors are formed in and on the fourth portions.

According to one embodiment, the first transistors are P-channel transistors and the second transistors are N-channel transistors.

According to one embodiment, insulating trenches extend through said layer and said insulator up to a level located inside the substrate, the insulating trenches surrounding regions of the chip.

According to one embodiment, at least one of the insulating trenches is located straddling the third and fourth portions.

According to one embodiment, a same region among said regions comprises another part of the cavities, at least one part of the first portions, and at least one part of the third portions or the fourth portions.

According to one embodiment:
  a first region in band form among said regions comprises parts of the third portions and the fourth portions;
  a second region in band form among said regions, parallel to the first region, comprises parts of the fourth portions and the first portions; and
  the first portions are elongated in a direction orthogonal to the bands, and the parts of the first portions located in the first region are aligned with the parts of the first portions located in the second region.

According to one embodiment, the stresses result from a modification of the composition of said layer in the third portions.

According to one embodiment, the composition modification comprises a silicon-germanium epitaxy on the third portions, followed by a heat treatment.

According to one embodiment, said layer is a layer of silicon.

According to one embodiment, the first transistors are of the FDSOI type.

According to one embodiment, transmitter, base and collector doped semiconductor zones of the bipolar transistors are located in epitaxied portions in said at least one part of the cavities.

According to one embodiment, additional field-effect transistors are formed in and on an epitaxied semiconductor in part of the cavities.

According to one embodiment, gates are formed on the second portions between the bipolar transistors.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 3A shows, through partial and schematic top and sectional views, a structure obtained in another step of the method;

FIG. 3B shows two partial and schematic sectional views of the structure of FIG. 3A;

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, steps for manufacturing phase change memory points are not described in detail, the described embodiments being compatible with the usual steps for manufacturing phase change memory points.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless otherwise specified, the adjectives in ordinal numbers, such as "first", "second", etc., are used simply to distinguish elements relative to one another. In particular, these adjectives do not limit the disclosed devices and methods to a particular order of these elements.

FIGS. 1A, 2A, 3A, 4A, 5A and 6A each show, through partial and schematic top T and sectional SA view along a plane A-A, a structure obtained in a step of one embodiment of a method for manufacturing an electronic chip. The views T and SA match one another.

Figure 1A:
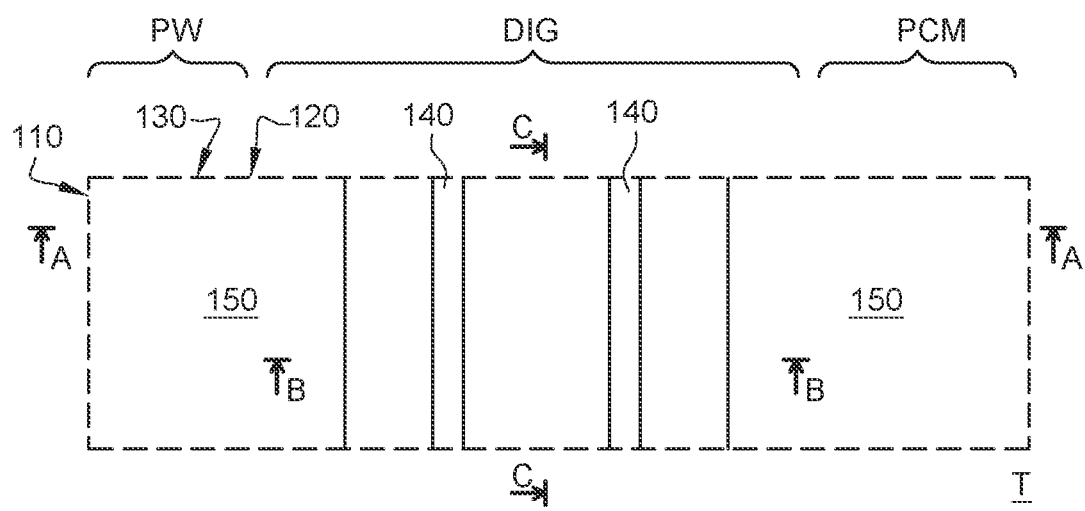
FIG. 1A shows, through partial and schematic top and sectional views, a structure obtained in a step of one embodiment of a method for manufacturing an electronic chip.
Figure 1B:
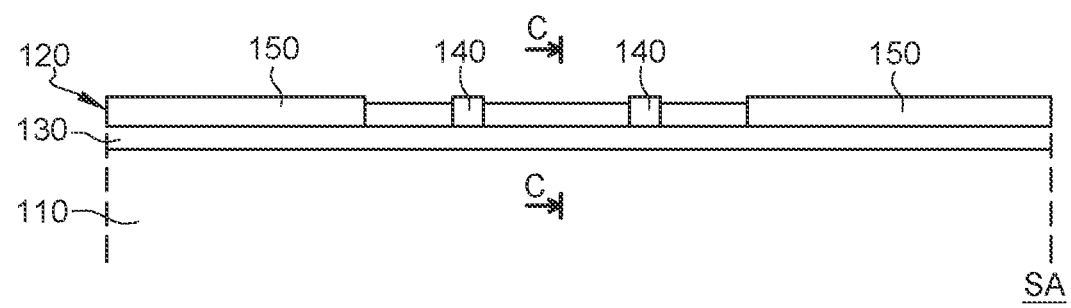
FIG. 1B shows two partial and schematic sectional views of the structure of FIG. 1A.
Figure 1B:
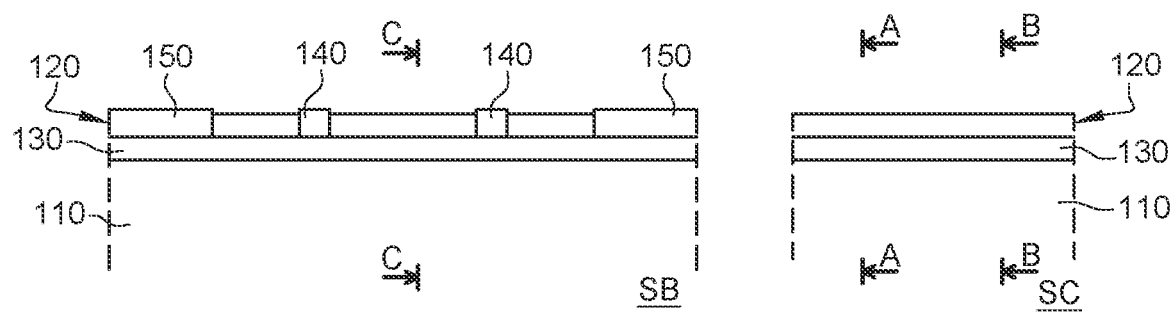
Figure 2A:
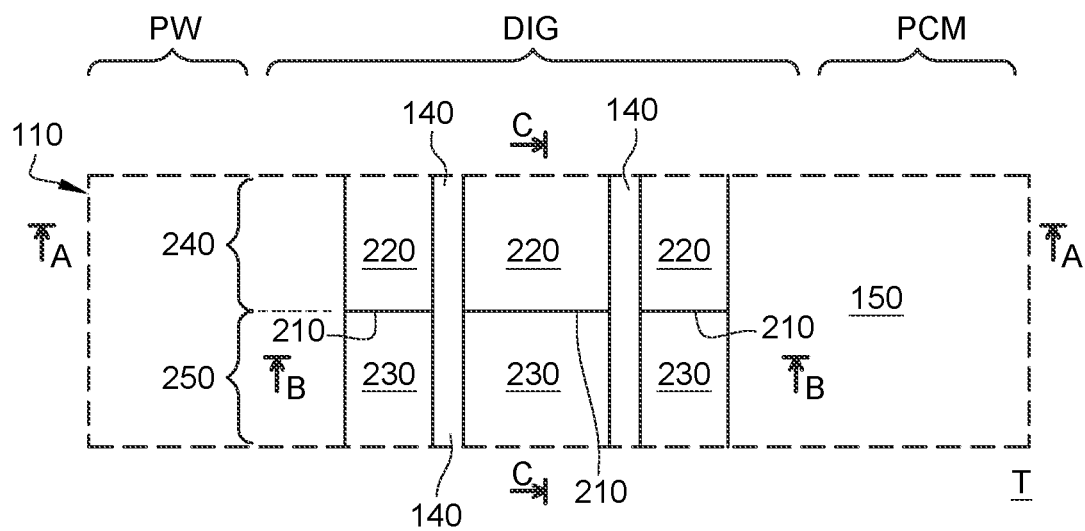
FIG. 2A shows, through partial and schematic top and sectional views, a structure obtained in another step of the method.
Figure 2A:
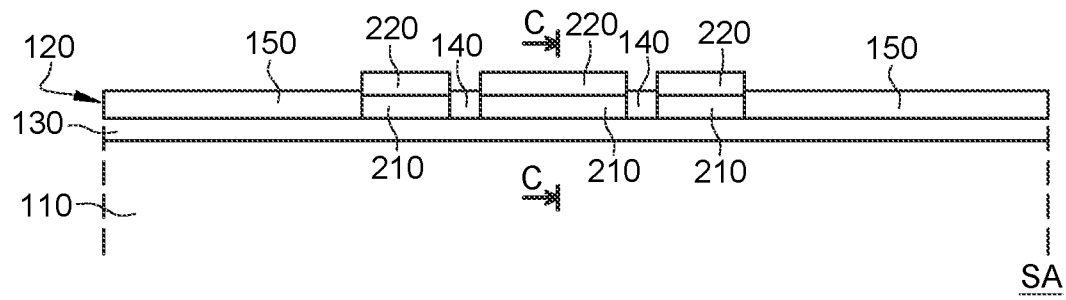
Figure 2B:
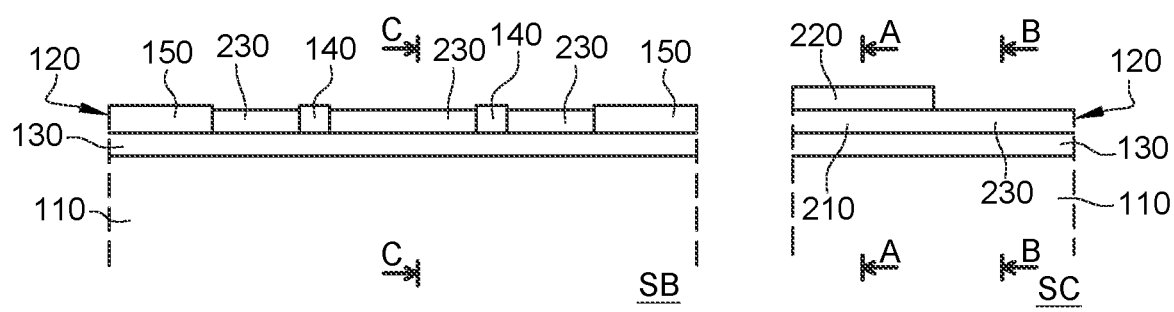
FIG. 2B shows two partial and schematic sectional views of the structure of FIG. 2A.

FIGS. 1B, 2B, 3B, 4B, 5B and 6B each show two partial sectional and schematic views of the respective structures of FIGS. 1A, 2A, 3A, 4A, 5A and 6A. Each of FIGS. 1B and 2B shows a sectional view SB along a plane B-B parallel to the plane A-A and a sectional view SC along a plane C-C orthogonal to the planes A-A and B-B. The views SB and SC match one another. Each of FIGS. 3B, 4B, 5B and 6B shows a sectional view SB along a plane B-B parallel to the plane A-A and a sectional view SD along a plane D-D parallel to the plane C-C. The views SB and SC match one another.

An electronic chip refers to a portion of semiconductor substrate 110 or semiconductor wafer, and electronic circuits located in and on the substrate 110. The chip obtained at the end of the method hereinafter will comprise, in a part DIG of the chip, one or more digital circuits comprising strained transistors, and in a part PCM of the chip, a phase change memory. Preferably, a part PW of the chip will comprise other transistors. These other transistors may be used in supply circuits intended to supply a voltage to the digital circuits of the chip, from a supply voltage applied to the chip to operate it.

Although the parts DIG, PCM and optionally the part PW are juxtaposed in the illustrated example, these parts are separate in other examples. In still other examples, the chip comprises a plurality of parts DIG and/or a plurality parts PCM and/or a plurality of parts PW.

In the step of FIGS. 1A and 1B, a semiconductor layer 120 is provided that is located on an electric (or dielectric) insulator 130 covering the substrate 110. In other words, the semiconductor layer 120, the insulator 130 and the substrate 110 constitute a so-called semiconductor on insulator (all) structure.

Preferably, the semiconductor layer 120 is a layer of silicon, and the insulator 130 is a layer of silicon oxide. The substrate 110 can be a silicon trench portion. As an example, the semiconductor layer 120 has a thickness inclusively between 3 nm and 10 nm.

The first and second portions, respectively 140 and 150, of the semiconductor layer 120 have been oxidized. More specifically, the first and second portions of the semiconductor layer 120 are oxidized over the entire thickness of the layer 120. To that end, it is possible to use any standard oxidation step of a semiconductor layer, typically a thermal oxidation. This step, being typical, is not described here in detail. In particular, a mask protecting portions of the semiconductor layer 120 from oxidation that one does not wish to oxidize in this step is not shown. This oxidation results in an increase in the thickness of the layer 120 in the oxidized portions.

The first portions 140 can be located in the digital part DIG of the future chip. Preferably, the first portions 140 have an elongation direction. The first portions 140 then form oxide bars that are parallel to one another. Although two first oxidized portions 140 are formed in the illustrated example, preferably, more than two first portions 140 are oxidized.

The second portions 150 can be located partially in the part PCM intended to contain the phase change memory. In the example where a part PW is provided, the second portions 150 can be located at least partially in the part PCM and in the part PW.

Preferably, in the part PCM and, optionally, the part PW, the entire semiconductor layer 120 is oxidized. In other words, the second portions 150 occupy the entirety of the parts PCM and optionally PW.

Second portions 150 can also be provided in the part DIG, for example on two opposite sides of the part DIG. In the illustrated example, the second portions 150 cover the entirety of the parts PCM and PW and extend over the part DIG.

In the step of FIGS. 2A and 2B, silicon-germanium 220 has been formed by epitaxy on third portions 210 of the layer of silicon 120. More specifically, the epitaxy is done on the side of the upper face of the structure (in the orientation of the sectional views), also called front face. As an example, the thickness of the epitaxied silicon-germanium 220 is inclusively between 3 and 10 nm.

Each third portion 210 extends between the oxidized portions, that is to say extends from one of the oxidized portions 140 and 150 to another of the oxidized portions 140 and 150. In other words, each of the third portions 210 is delimited, on two opposite sides, by two portions among the first and second portions 140 and 150.

Preferably, a plurality of portions among the third portions are located, in top view, in a same band 240. The other third portions, not shown, can be located in other bands parallel to the band 240. The third portions 210 of the band 240 are separated by the first portions 140.

During the epitaxy, a discrepancy between crystalline meshes causes, in the epitaxied silicon-germanium 220, compression stresses parallel to the front face (that is to say, horizontal in the orientation (the orientation?) of the sectional views).

Preferably, next to each of the third portions 210, the semiconductor layer 120 comprises a fourth portion 230 that is not oxidized and not covered with epitaxied silicon-germanium that extends between the oxidized portions in question. In other words, between two adjacent oxidized portions among the first portions and second portions 140 and 150, one of the third portions 210 and one of the fourth portions 230 extend parallel next to one another. Preferably, a plurality of portions among the fourth portions 230 are located, in top view, in a same band 250 parallel to the band 240. The bands 240 and 250 are located side by side. The other fourth portions, not shown, can be located in other bands parallel to the band 250.

The fourth portions 230, not covered with epitaxied silicon-germanium, can be covered, during the epitaxy, with any usual mask configured to protect a portion of a layer of silicon to prevent epitaxied silicon-germanium from crossing from this layer portion.

In the step of FIGS. 3A and 3B, a heat treatment has been done, so as to oxidize the front face of the entire structure of FIGS. 2A and 2B. The silicon of the silicon-germanium 220 preferably oxidizes, and the germanium of the silicon-germanium 220 migrates toward the third portion 210 of the layer 120 of silicon. This results in an intensification and a transfer of the third portion of the stresses initially present in the silicon-germanium 220.

As a result, compression stresses 310 have been generated in the third portions 210. The compression stresses 310 are in both horizontal directions (in the orientation of the sectional views). In order to generate the stresses 310, the composition of the third portions 210 has been modified. In other words, the third portions 210 and fourth portions 230 have different compositions, namely, preferably, the third portions 210 are made from silicon-germanium, and the fourth portions 230 are made from silicon. Thus, the layer 120 still comprises the semiconductor in its initial composition, here the silicon, but, in the present step, has different compositions in the first and second portions, in the third portions and in the fourth portions.

Preferably, the front face of the structure is next cleaned, so as to remove the remains of the silicon-germanium 220, substantially made up of silicon oxide.

The specific example described above for generating stresses in the third portions 210 is not limiting. The described embodiments are compatible with the usual methods for generating stresses in portions of a semiconductor layer.

Figure 4A:
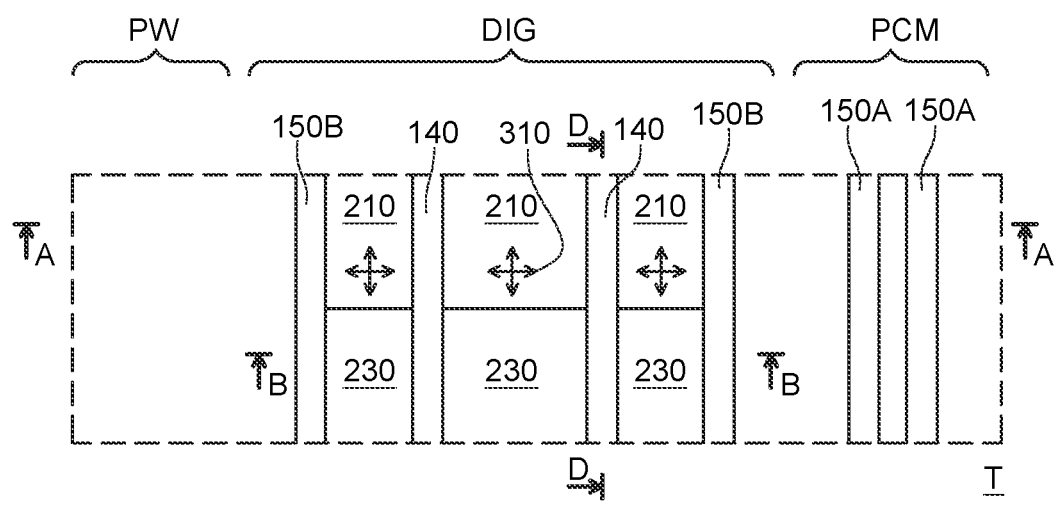
FIG. 4A shows, through partial and schematic top and sectional views, a structure obtained in another step of the method.
Figure 4B:
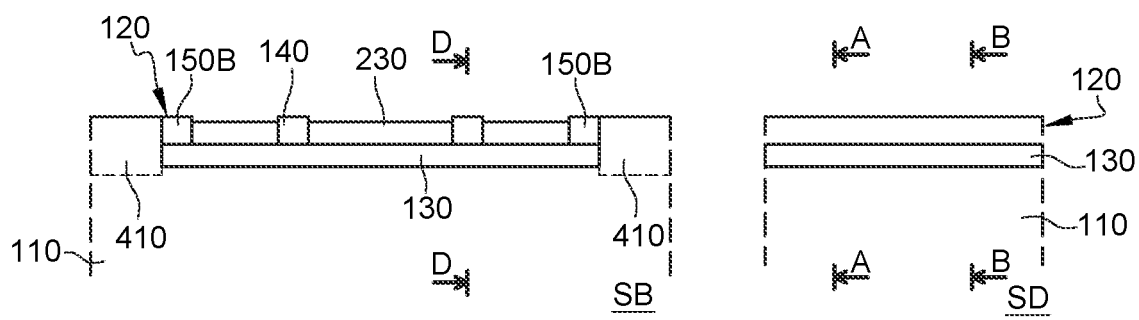
FIG. 4B shows two partial and schematic sectional views of the structure of FIG. 4A.

In the step of FIGS. 4A and 4B, cavities 410 are etched extending at least to the substrate 110 through the second portions 150 and the insulator 130. The cavities 410 reach the substrate 110 and can penetrate the substrate 110.

Preferably, in the part PCM intended to comprise the future phase change memory, stacks 430 of parts 130A and 150A respectively of the insulator 130 and second oxidized portions 150 are left in place. The cavities 410 delimit the stacks 430.

Although only two stacks 430 are provided in the illustrated example, the number of stacks 430 is preferably greater than two. Preferably, seen from above, the stacks 430 are in the shape of bands parallel to the first portions 140. The stacks 430 then form electrically insulating bars.

Preferably, in the part DIG intended to comprise the future strained transistors, parts 150B of the second oxidized portions 150 are also left in place against the third and fourth portions 210 and 230.

A semiconductor is next formed, by epitaxy, in the cavities 410. The epitaxied semiconductor is typically the same as that of the substrate 110, namely, preferably, made from silicon. Each cavity 410 is filled with an epitaxied semiconductor portion 420. Preferably, the epitaxied semiconductor portions 420 reach a level located above (in the orientation of the sectional views) the upper level of the third portions 210 and the upper level of the fourth portions 230. In other words, the epitaxied semiconductor portions 420 exceed the levels of the front faces of the third and fourth portions 210 and 230. In the part PCM, the epitaxied semiconductor portions 420 are electrically insulated from one another by the stacks 430.

Figure 5A:
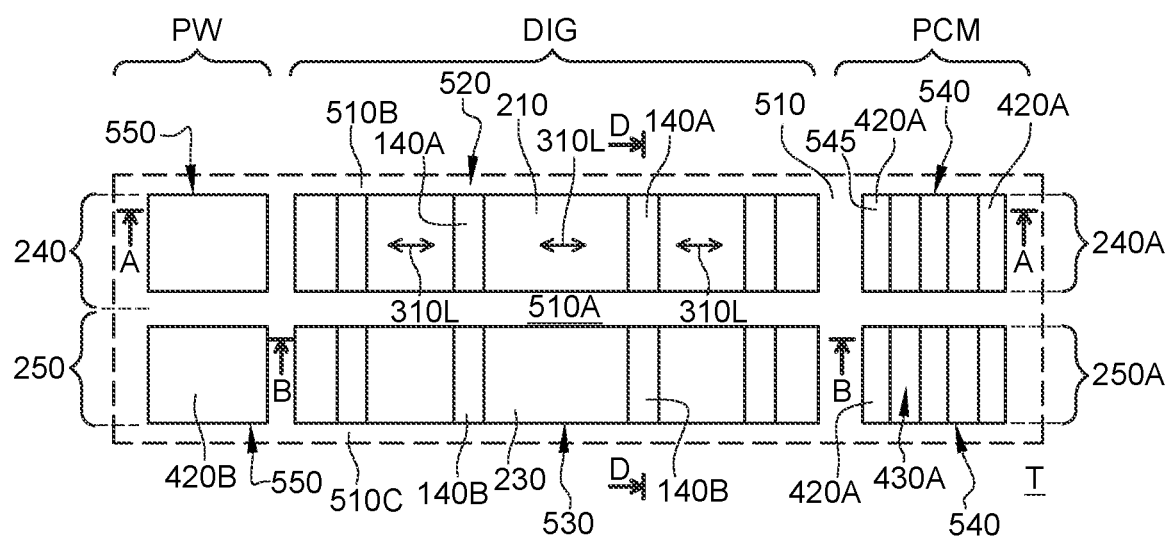
FIG. 5A shows, through partial and schematic top and sectional views, a structure obtained in another step of the method.
Figure 5B:
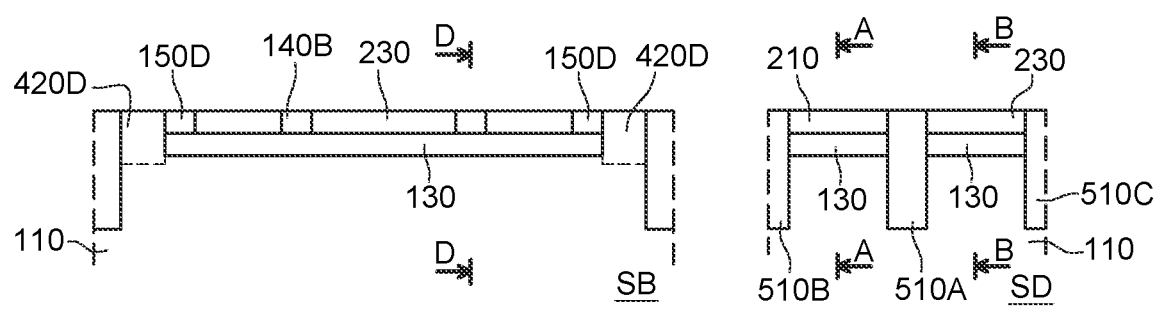
FIG. 5B shows two partial and schematic sectional views of the structure of FIG. 5A.

In the step of FIGS. 5A and 5B, preferably, all of the elements have been removed from the structure of FIGS. 4A and 4B that are located above the level of the upper face of the fourth portions 230. To that end, it is possible to carry out a standard mechanical-chemical polishing step.

Preferably, insulating trenches 510 have been formed, that is to say, trenches filled with an electrical insulator, preferably of the silicon oxide type. In other words, an etching step of the trenches is successively carried out, followed by a step for filling with the electrical insulator. These steps are not described here in detail, the described embodiments being compatible with the usual etching and filling steps in order to form insulating trenches. Preferably, the insulating trenches 510 separate the parts DIG, PCM, and optionally PW.

The insulating trenches 510 extend from the front face, pass through the level occupied by the first, second, third and fourth portions of the layer 120, and through the insulator 130, to a level located inside the substrate 110.

The locations of the insulating trenches 510 are chosen such that the insulating trenches 510 surround (in top view) regions of the chip. The etching of the insulating trenches 510 leaves a central part of each of the third and fourth portions 210 and 230 in place; in other words, the insulating trenches 510 reduce the dimensions of the third and fourth portions. The etching leaves parts 140A, 140B of the first portions 140 and parts 430A of the stacks 430 in place.

Among the regions of the chip surrounded by the insulating trenches 510, one or more regions 540 located in the part PCM comprise semiconductor portions 420A made up of a part of the epitaxied semiconductor portions 420. Respective transmitter, base and collector doped semiconductor zones (not shown in detail) are formed of a bipolar transistor 545 in each of the semiconductor portions 420A. These zones can be formed by doping during the epitaxy, or preferably, by doping of the semiconductor portions 420A. The bipolar transistors 545 are preferably of the NPN type. The doped zones of the bipolar transistors 545 are insulated relative to one another by the parts 430A of the stacks.

Among the regions surrounded by the insulating trenches 510, a region 520 located in the part DIG comprises the parts 140A of the first portions 140 and a plurality of portions among the third portions 210. Preferably, the region 520 comprises one or more semiconductor portions 420C made up of a part of the epitaxied semiconductor portions 420. The semiconductor portions 420C of the region 520 are electrically insulated from the third portions 210 by parts 150C of the second oxidized portions 150. The parts 150C correspond to the parts 150B having stayed in place in the region 520 after formation of the insulating trenches 510.

Preferably, among the regions surrounded by the insulating trenches 510, a region 530 located in the part DIG comprises the parts 140B of the first portions 140 and a plurality of portions among the fourth portions 230. More preferably, the region 530 comprises one or more semiconductor portions 420D made up of a part of the epitaxied semiconductor portions 420. The semiconductor portions 420D of the region 530 are insulated from the fourth portions 230 by parts 150D of the second oxidized portions 150. The parts 150D correspond to the parts 150B having stayed in place in the region 530 after formation of the insulating trenches 510.

Preferably, among the insulating trenches 510, one insulating trench 510A extends, in top view, parallel to the bands 240 and 250 and straddling the bands 240 and 250. The insulating trench 510A is thus located straddling the locations of the third portions 210 and fourth portions 230. The parts 140A of the first portions 140 located in the region 520 are aligned with the parts 140B of the first portions located in the region 530, that is to say that the parts 140A and 140B have shapes elongated orthogonally to the bands 240 and 250 and that each part 140A is co-linear with a part 140B.

The insulating trenches 510 are formed after generation of the stresses 310. As a result, the third portions 210 can be elongated in the insulating trench 510A after filling, which relaxes the stresses 310 in the direction orthogonal to the band 240. However, because the parts 140A are formed before generation of the stresses 310, the stresses in the direction of the bands 240 and 250 are advantageously prevented from being relaxed.

Thus, after formation of the insulating trenches 510, 510A, the third portions 210 have compression stresses 310L in the longitudinal direction of the band 240, and are substantially not stressed in the transverse direction of the band 240.

Preferably, among the insulating trenches 510, one insulating trench 510B is located relative to the third portions 210 on the side opposite the insulating trench 510A, extends parallel to the band 240 and delimits the third portions 210. Thus, the region 520 is located in a central band 240A of the band 240. Preferably, among the insulating trenches 510, one insulating trench 510C is located relative to the fourth portions 230 on the side opposite the insulating trench 510A, extends parallel to the band 250 and delimits the fourth portions 230. Thus, the region 530 is located in a central band 250A of the band 250.

Preferably, among the regions of the chip surrounded by the insulating trenches 510, one region 550 located in the part PW comprises semiconductor portions 420B made up of all or part of the epitaxied semiconductor portions 420.

In the illustrated example, the insulating trenches 510A, 510B and 510C, which extend parallel to the central band 240A and 250A, extend in the parts PCM and PW. As a result, the part PCM comprises a region 540 in each of the central bands 240A and 250A, and the part PW comprises a region 550 in each of the central bands 240A and 250A.

Figure 6A:
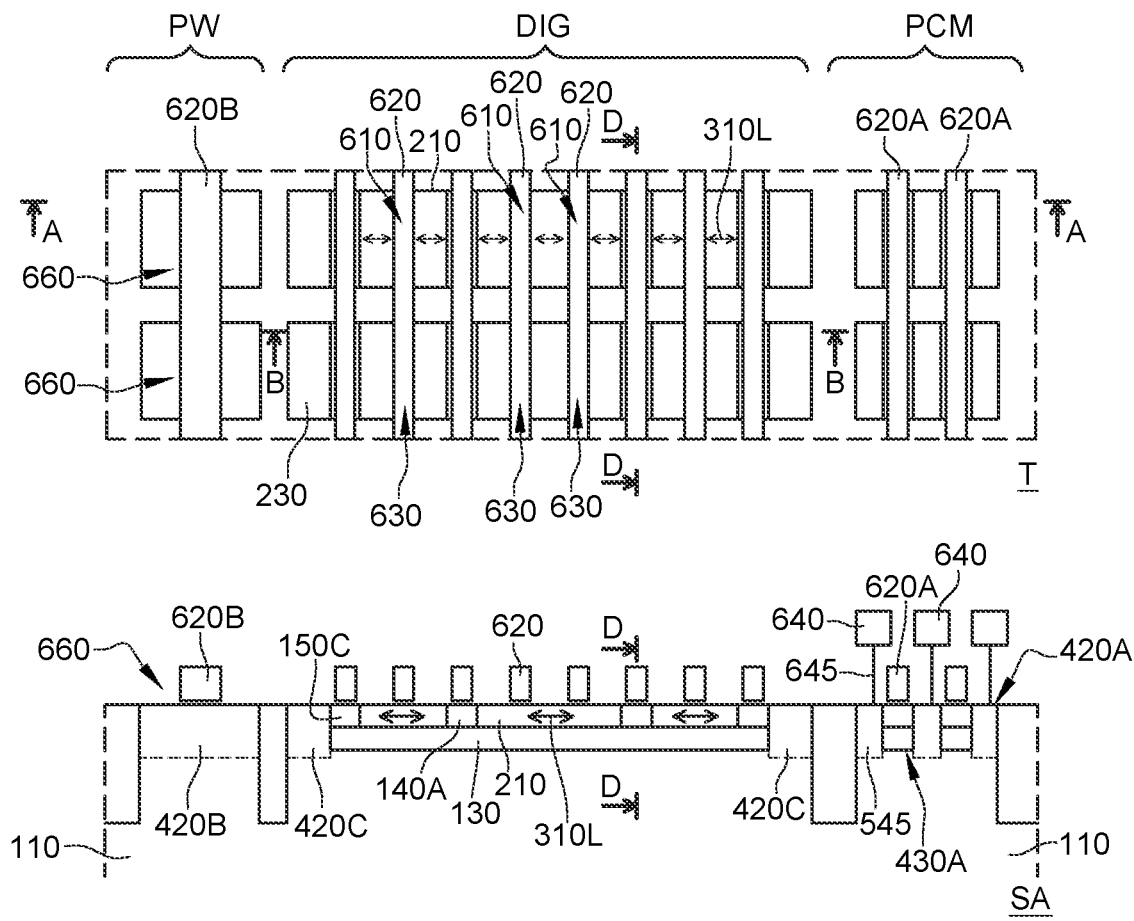
FIG. 6A shows, through partial and schematic top and sectional views, a structure obtained in another step of the method.
Figure 6B:
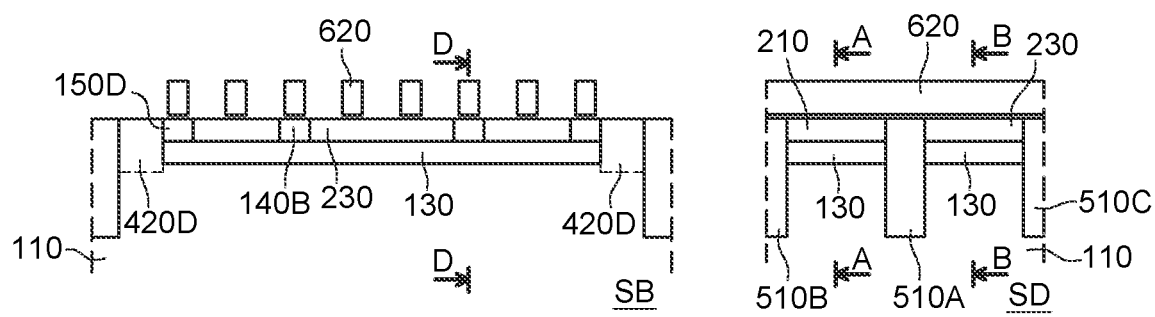
FIG. 6B shows two partial and schematic sectional views of the structure of FIG. 6A.

In the step of FIGS. 6A and 6B, field effect transistors 610 are formed in and on the third portions 210. More specifically, gates 620 are formed on the third portions 210, preferably elongated orthogonally to the direction of the bands 240A and 250A (FIG. 5A). The oxidized parts 140A insulate the transistors 610 relative to one another. A same third portion 210 can comprise a plurality of transistors 610, for example transistors having a common drain-source terminal. Preferably, the gates are evenly spaced apart, and the positions of the first portions 140 have been provided so that some of the gates 620 are located on the parts 140A of the first portions 140.

The parts of the third portions 210 located below the gates 620 constitute channel formation regions of the transistors 610. Due to the presence of the stresses 310L, the transistors 610 are strained transistors. Preferably, the parts of the third portions 210 located on either side of the channel formation regions are P-doped in order to form drain and source regions of the transistors 610. The transistors 610 are thus P-channel transistors. In the channel region, the presence of compression stresses in the drain-source direction (length direction of the transistors) and, substantially, the absence of stress in the width direction of the transistors, allows particularly fast P-channel transistors 610 to be obtained.

The other elements of the field-effect transistors are not described, the described embodiments being compatible with the usual methods for forming field-effect transistors on a portion of a semiconductor layer. In particular, it is possible to provide that conductive zones in electrical contact with the drain-source regions (that is to say contact zones or contacts) are formed, for example epitaxied, on the third regions 210 on either side of the gates 620.

Preferably, field effect transistors 630 are formed in and on the fourth portions 230. More specifically, the parts of the fourth portions 230 located below the gates 620 constitute channel formation regions of the transistors 630. Preferably, the parts of the fourth portions 230 located on either side of the channel formation regions are P-doped in order to form drain-source regions of the transistors 630. The transistors 630 are thus N-channel transistors, and allows digital circuits to be formed with the P-channel transistors 610.

Preferably, the transistors 610 and 630 are of the fully depleted SOI (FDSOI) type. An FDSOI transistor here means that the thickness of their channel region is smaller than 10 nm.

Preferably, in the PCM part, phase change memory points 640 have been formed. The memory points 640 are for example located in insulating layers, not shown, covering the structure. Each memory point is coupled, preferably connected, to one of the bipolar transistors 545. More specifically, the memory point 640 and the bipolar transistor 545 are electrically in series. For each memory point 640, a via 645 can connect the memory point 640 and the associated bipolar transistor 545.

In the operating chip, during a writing and/or reading step of the phase change memory, the memory point(s) 640 affected by the writing or the reading are selected by turning on the bipolar transistor(s) 545 in series with this or these memory points 640. The bipolar transistors 545 are thus called selection transistors.

In the chip obtained by the above method:

the electrical insulators, made up of the parts 140A of the first oxidized portions 140, between the strained transistors 610; and the electrical insulators, made up of the parts 150A of the second oxidized portions 150, between the bipolar selection transistors 545 of the phase change memory, result from a single oxidation step of the layer 120.

Relative to a method in which the electrical insulators have been obtained in different steps, this allows the number of steps to form these insulators to be reduced. At the same time, the method has the advantage, mentioned above, that the stresses 310L are maintained in the length direction of the transistors 610 and released in the width direction.

Preferably, in the case where the semiconductor portions 420C and 420D have been provided in the respective regions 520 and 530, these portions are doped, in this step or in an earlier step, with a same type of conductivity (among the two types N and P) as the substrate 110 or a doped box formed below the insulator 130 below the respective regions 520 and 530. In the case where boxes (not shown) are formed below the respective regions 520 and 530, these boxes can be electrically insulated relative to one another owing to the insulating trench 510A.

Each of the semiconductor portions 420C and 420D can then be topped by a contact. The application of a potential on the contact makes it possible to polarize the substrate 110 or the box below the region 520, 530 in question. This polarization serves to electrostatically control the respective transistors 610, 630, through the insulator 130. Such control is desirable, for example, to modify the threshold voltage of the transistors 610, 630 based on a desired compromise between speed and consumption of the transistors.

Preferably, gates 620A have been formed on the stacks 430 at the same time as the gates 620. In the case where electrical contact zones with the emitter, base and/or collector regions of the bipolar transistors 545 are formed, for example epitaxied, on the semiconductor portions 420A, the gates 620A allows these zones to be formed without risk of unwanted conductive bridges forming on the stacks 430 and causing short-circuits between adjacent bipolar transistors 545.

Preferably, in the part PW, a transistor 660 has further been formed, having a gate 620B, in and on the semiconductor portion 420B. In other words, the transistor 660 has a channel-forming region located in a part of the epitaxied region 420 located below the gates 620B and separated from the gate by a gate insulator, not shown. Preferably, the transistor 660 has a gate insulator thickness greater than that of the transistors 610 and 630. This allows the transistor 660 to have a maximum gate-source voltage (beyond which the transistor could be damaged) greater than that of the transistors 610 and 620. The gate 620B is preferably formed at the same time as the gates 620 and 620A.

Various embodiments and alternatives have been described. Those skilled in the art will understand that certain features of these embodiments can be combined and other alternatives will readily occur to those skilled in the art.

Finally, the practical implementation of the described embodiments and alternatives is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic chip, comprising:
   oxidizing a plurality of first portions and a plurality of second portions of a semiconductor layer down to an insulator, the insulator covering a semiconductor substrate, the semiconductor layer disposed on the insulator;
   generating stresses in third portions of the semiconductor layer, each of the third portions extending between two portions of any of the first or second portions of the semiconductor layer; and
   forming cavities extending at least to the substrate through the second portions and the insulator.

2. The method of claim 1, further comprising:
   forming bipolar transistors in at least part of the cavities;
   forming first field effect transistors in and on the third portions; and
   forming phase change memory points coupled to the bipolar transistors.

3. The method of claim 2, further comprising:
   forming second field effect transistors in and on fourth portions of the semiconductor layer, each of the fourth portions located adjacent to a respective third portion and extending between the two portions of any of the first or second portions of the semiconductor layer.

4. The method of claim 3, wherein the first field effect transistors are P-channel transistors and the second field effect transistors are N-channel transistors.

5. The method of claim 3, further comprising:
   forming insulating trenches extending through the semiconductor layer, the insulator, and at least partially into the substrate, the insulating trenches surrounding regions of the electronic chip.

6. The method of claim 5, wherein at least one of the insulating trenches is located straddling the third and fourth portions.

7. The method of claim 5, wherein a same region among the regions includes at least part of the cavities, at least one part of the first portions, and at least one part of the third portions or the fourth portions.

8. The method of claim 5, wherein:
   a first region in band form among the regions includes parts of the third portions and the fourth portions;
   a second region in band form among the regions, parallel to the first region, includes parts of the fourth portions and the first portions; and
   the first portions are elongated in a direction orthogonal to the bands, and the parts of the first portions located in the first region are aligned with the parts of the first portions located in the second region.

9. The method of claim 2, wherein the first field effect transistors are of the FDSOI type.

10. The method of claim 2, wherein transmitter, base and collector doped semiconductor zones of the bipolar transistors are located in epitaxied portions in at least part of the cavities.

11. The method of claim 2, further comprising:
   forming additional field-effect transistors in and on an epitaxied semiconductor layer in part of the cavities.

12. The method of claim 2, further comprising:
forming gates on the second portions between the bipolar transistors.

13. The method of claim 1, wherein generating the stresses in the third portions includes modifying a composition of the semiconductor layer in the third portions.

14. The method of claim 13, wherein modifying the composition of the semiconductor layer includes:
forming a silicon-germanium epitaxy layer on the third portions; and
performing a heat treatment on the third portions.

15. The method of claim 1, wherein the semiconductor layer is a layer of silicon.

16. An electronic chip, comprising:
a semiconductor substrate;
an insulator on the semiconductor substrate;
a semiconductor layer on the insulator, the semiconductor layer including first, second and third portions, the first and second portions of the semiconductor layer being oxidized down to the insulator, and the third portions being strained and each extending between two oxidized portions of the semiconductor layer;
bipolar transistors at least partially located in cavities extending at least to the substrate through the second portions and the insulator;
first field effect transistors located in and on the third portions; and
phase change memory points coupled to the bipolar transistors.

17. The electronic chip of claim 16, further comprising:
second field effect transistors in and on fourth portions of the semiconductor layer, each of the fourth portions located adjacent to a respective third portion and extending between the two oxidized portions of the semiconductor layer.

18. The electronic chip of claim 17, further comprising:
insulating trenches extending through the semiconductor layer, the insulator, and at least partially into the substrate, the insulating trenches surrounding regions of the electronic chip.

19. A method, comprising:
oxidizing a first portion and a second portion of a semiconductor layer, the semiconductor layer disposed on a dielectric layer, the dielectric layer at least partially covering a semiconductor substrate;
generating stresses in a third portion of the semiconductor layer, the third portions extending between the first portion and the second portion of the semiconductor layer;
forming a cavity extending through the second portion, the dielectric layer, and at least partially into the substrate; and
forming a bipolar transistor at least partially in the cavity.

20. The method of claim 19, further comprising:
forming a phase change memory point coupled to the bipolar transistor.

* * * * *